(12) United States Patent
Pan

(10) Patent No.: US 6,373,121 B1
(45) Date of Patent: Apr. 16, 2002

(54) SILICON CHIP BUILT-IN INDUCTOR STRUCTURE

(75) Inventor: Jui-Hsiang Pan, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/815,861

(22) Filed: Mar. 23, 2001

(51) Int. Cl.$^7$ ............................................... H01L 29/00
(52) U.S. Cl. ...................... 257/531; 257/379; 257/509; 257/516; 257/528; 257/544; 257/647; 257/648
(58) Field of Search ................................ 257/379, 516, 257/528, 531, 509, 495, 544, 647, 648

(56) References Cited

U.S. PATENT DOCUMENTS

| | | | | |
|---|---|---|---|---|
| 5,416,356 A | * | 5/1995 | Staudinger et al. | 257/531 |
| 5,559,349 A | * | 9/1996 | Cricchi et al. | 257/273 |
| 5,930,637 A | * | 7/1999 | Chuang et al. | 257/531 |
| 5,994,738 A | * | 11/1999 | Wollesen | 257/347 |
| 6,002,161 A | * | 12/1999 | Yamazaki | 257/531 |
| 6,201,289 B1 | * | 3/2001 | Jou | 257/531 |
| 6,326,673 B1 | * | 12/2001 | Liou | 257/499 |

* cited by examiner

*Primary Examiner*—Eddie Lee
*Assistant Examiner*—N. Drew Richards
(74) *Attorney, Agent, or Firm*—J.C. Patents

(57) ABSTRACT

A silicon chip built-in inductor structure. The structure at least includes a substrate, a plurality of active devices on the substrate, a dielectric layer with a planarized upper surface and an inductor device. The substrate can be divided into an active device region and a region containing grid-like field oxide devices. The grid-like field oxide region has a plurality of field oxide layers, a plurality of first-type-ion-doped regions underneath the field oxide layers and a plurality of second-type-ion-doped region in the substrate between the various field oxide layers. A plurality of junction regions are formed between the first-type-ion-doped regions and the second-type-ion-doped regions. The junction regions impede the flow of an eddy current along a prescribed direction. A dielectric layer is formed over the substrate covering the active devices and the field oxide devices. The inductor device is formed on the dielectric layer above the field oxide devices.

13 Claims, 3 Drawing Sheets

SILICON CHIP BUILT-IN INDUCTOR STRUCTURE

BACKGROUND OF THE INVENTION

1. Field of Invention

The present invention relates to a silicon chip built-in inductor structure. More particularly, the present invention relates to a type of field oxide inductor having an electrostatic shield underneath for stopping the circulation of eddy current inside a silicon substrate.

2. Description of Related Art

Due to cost considerations, most high frequency silicon chips have passive devices, such as inductors, formed therein. Because these inductors are formed close to the silicon substrate (often within 10 micrometers of the substrate), so a lot of energy is lost through the substrate during operation so that the quality factor (Q-factor) of the inductor may be reduced. Gallium-arsenic (GaAs) is a type of semiconductor material that has an insulating effect at high operating frequency. Therefore, expensive gallium-arsenic material instead of common silicon material is frequently used in the production of high frequency chips so that inductor performance is improved and energy is saved. However, the cost of gallium-arsenic is so overwhelming that the production cost of a complementary metal-oxide-silicon (CMOS) becomes relatively unimportant.

FIG. 1 is a schematic cross-sectional view of a conventional silicon chip with a built-in inductor thereon. As shown in FIG. 1, the structure includes a silicon substrate 100 divided into an active region 102 and an isolation region 104. The active region 102 contains a plurality of active devices separated from each other by field oxide (FOX) layers within the isolation region 104. A planarized dielectric layer 106 is formed over the active devices and the isolation region 104. A built-in inductor 108 is formed over the dielectric layer 106. The built-in inductor 108 includes multiple layers of induction coils 108a electrically isolated by dielectric layers 108b. In addition, various inductor coils 108a are electrically linked via plugs 108c.

Since the inductor 108 is built on the isolation region 104 such as the field oxide (FOX) above the silicon chip 100, electromagnetic induction during operation may produce an eddy current I inside the silicon substrate 100. The eddy current I may flow along the axial direction of the inductor coil 108a. Consequently, the eddy current may lead to a drop in the Q-value of the inductor 108. Ultimately, performance of the inductor 108 at high frequency is compromised.

SUMMARY OF THE INVENTION

Accordingly, one object of the present invention is to provide a silicon chip built-in inductor structure. The built-in inductor is formed above a field device that comprises of an n-well, a field oxide (FOX) layer and a p-well underneath the field oxide layer. Because the deep p-n junction between the n-well and the p-well can provide an effective barrier for the flow of eddy current in the substrate, energy loss is greatly reduced.

To achieve these and other advantages and in accordance with the purpose of the invention, as embodied and broadly described herein, the invention provides a silicon chip built-in inductor structure. The structure at least includes a substrate, a plurality of active devices on the substrate, a dielectric layer with a planarized upper surface and an inductor device. The substrate can be divided into an active device region and a region having grid-like field oxide devices. The grid-like field oxide region comprises of a plurality of field oxide layers, a plurality of first-type-ion-doped regions underneath the field oxide layers and a plurality of second-type-ion-doped regions in the substrate between various field oxide layers. A plurality of junction regions are formed between the first-type-ion-doped regions and the second-type-ion-doped regions. The junction regions impede the flow of an eddy current along a prescribed direction. In addition, a dielectric layer is formed over the substrate covering the active devices and the field oxide devices. The inductor device is formed on the dielectric layer above the field oxide devices. Since the first-type-ion-doped region and the second-type-ion-doped region are positioned alternately and in parallel to each other within the substrate, their junctions establish a grid-like structure capable of stopping inductor induced eddy current flow inside the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
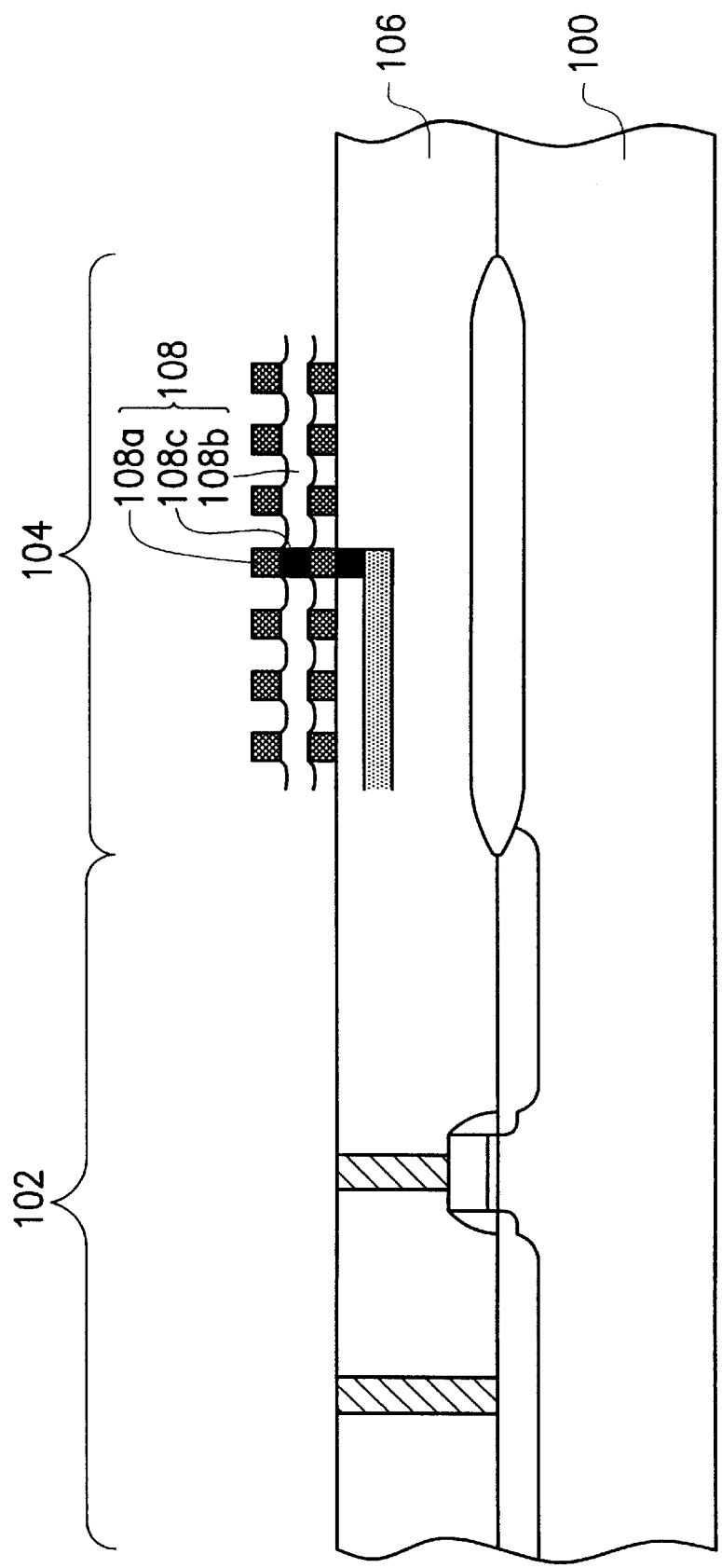
FIG. 1 is a schematic cross-sectional view of a conventional silicon chip with a built-in inductor thereon.

Reference will now be made in detail to the present preferred embodiments of the invention, examples of which are illustrated in the accompanying drawings. Wherever possible, the same reference numbers are used in the drawings and the description to refer to the same or like parts.

Figure 2:
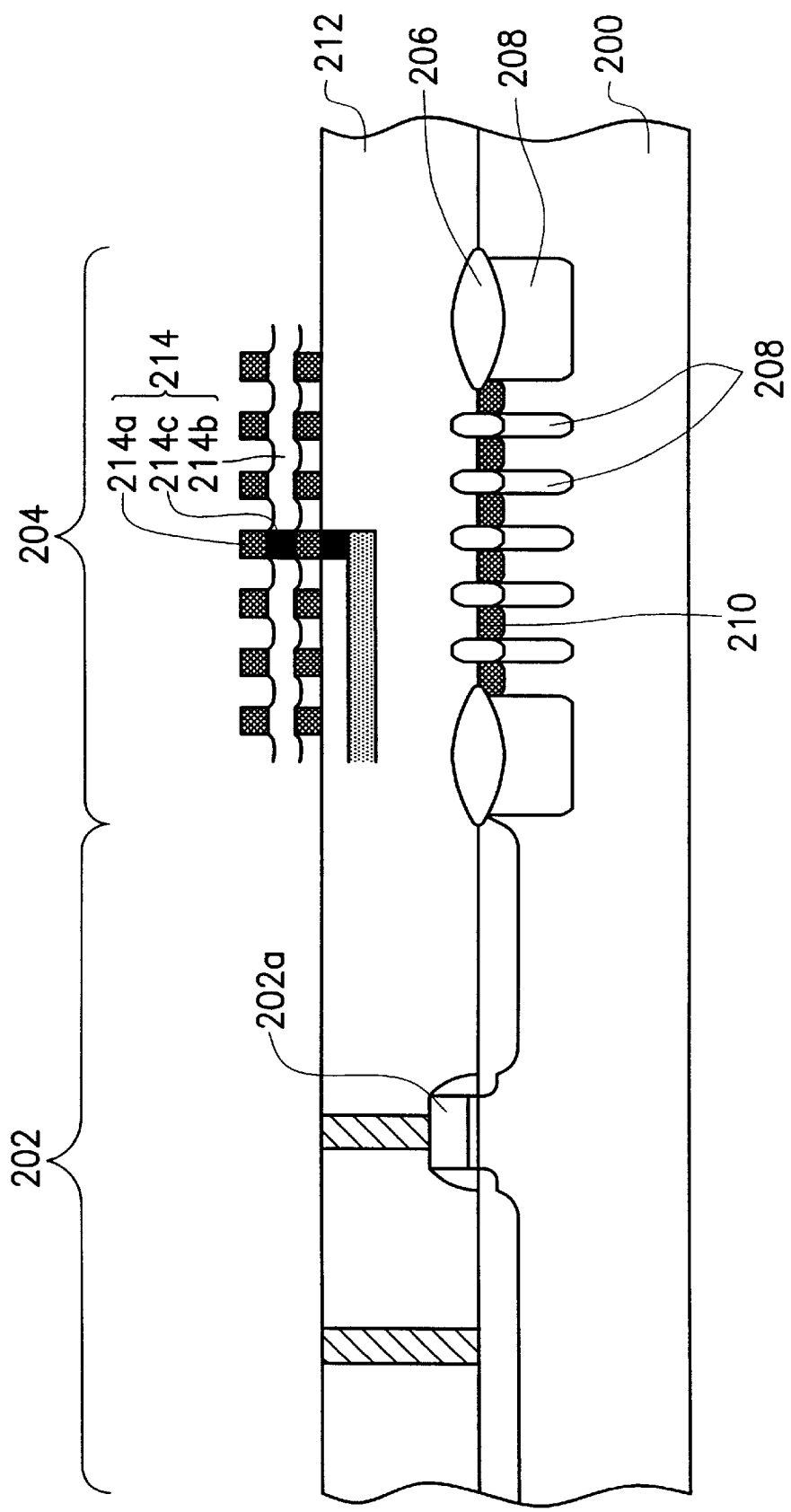
FIG. 2 is a schematic cross-sectional view of a silicon chip with a built-in inductor thereon fabricated according to a preferred embodiment of this invention.

FIG. 2 is a schematic cross-sectional view of a silicon chip with a built-in inductor thereon fabricated according to a preferred embodiment of this invention.

As shown in FIG. 2, a substrate, such as a silicon substrate, is provided. The substrate 200 can be divided into an active device region 202 and an isolation region 204. A plurality of active devices 202a are formed in the active region 202. A plurality of field oxide layers 206 all parallel to each other are formed in the isolation region 204. The field oxide layers 206 are formed, for example, by local oxidation of silicon (LOCOS). The LOCOS process is carried out when the active region 202 and the isolation region 204 are patterned. For example, a patterned silicon nitride layer is used as a mask in an oxidation so that a portion of the areas above the isolation layer 204 is turned into field oxide layers 206. Before forming the field oxide layers, a first-type-ion implantation is carried out. Thereafter, the substrate 200 is placed inside an oxidation furnace to form the field oxide layer 206 above the isolation region 204. Through the application of a high temperature inside the furnace, the first-type ions are driven into the substrate 200 to form a first-type-ion-doped region 208. The silicon nitride layer is subsequently removed.

After removing the silicon nitride layer, a second-type-ion implantation is conducted using the field oxide layers 206 as a mask. An annealing treatment is executed to drive the implanted second-type ions into the substrate 200 so that a second-type-ion-doped region 210 is formed. The first-type-ion-doped region 208 and the second-type-ion-doped region 210 contain different types of dopants. For example, the first-type-ion-doped region 208 contains n-type dopants while the second-type-ion-doped region 210 contains p-type dopants. Alternatively, the first-type-ion-doped region 208 contains p-type dopants while the second-type-ion-doped region 210 contains n-type dopants. Ultimately, a p-n junction is formed at the interfacial region between the first-type-ion-doped region 208 and the second-type-ion-doped region 210.

As shown in FIG. 2, there is a dielectric layer 212 above the substrate 200. The dielectric layer 212 can be a silicon dioxide (SiO2) or other low dielectric constant material layer having a planarized upper surface. The dielectric layer 212 mainly serves as a protective layer for the active devices 202a and as an insulating layer for a passive device 214 above the substrate 200. The passive device 214 can be an inductor 214, for example. The inductor includes multi-layered inductive coils 214a. Various inductive coils 214a are electrically insulated by dielectric layers 214b, for example. The inductive coils are mutually linked via conductive plugs 214c.

Although the inductor 214 is electrically isolated from the substrate by the field oxide layers 206 and the dielectric layer 212, electromagnetic induction may still occur leading to the production of an eddy current in the substrate 200. By forming grid-like field oxide devices using the field oxide layer 206, the first-type-ion-doped region 208 and the second-type-ion-doped region 210, eddy current within the substrate 200 is blocked. Since Q-value of the inductor 214 can be maintained at high frequency, performance of the inductor 214 is improved.

The field oxide layers, the first-type-ion-doped region underneath the field oxide layers and the second-type-ion-doped region in the substrate together form a grid-like structure. The field oxide layer 206 extends an overall distance of separation between the inductor 214 and the substrate 206. The junction regions between the first-type-ion-doped region and the second-type-ion-doped region impede the flow of an eddy current in the substrate induced by the inductor 214.

Figure 3:
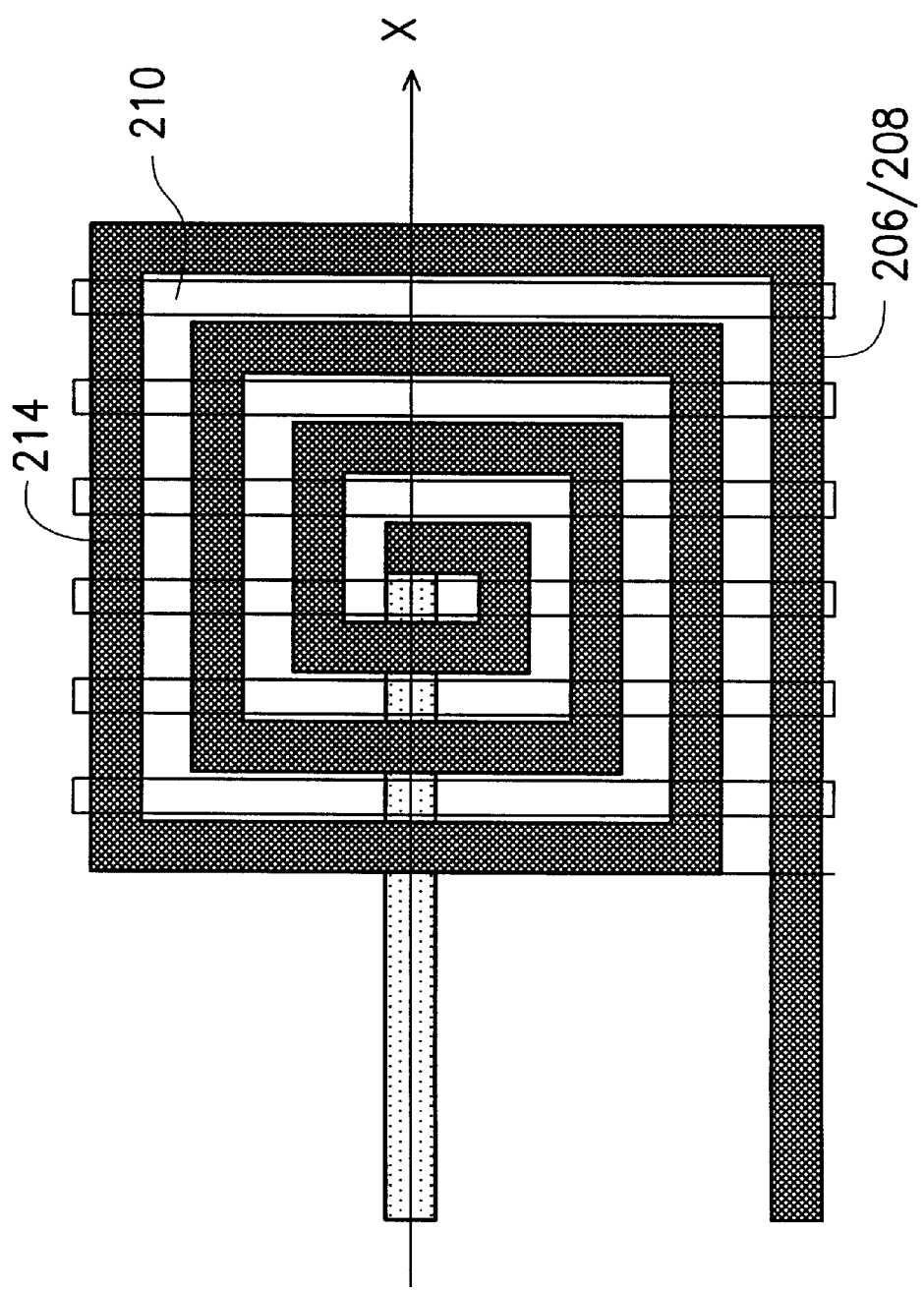
FIG. 3 is a top view showing a built-in inductor on a substrate according to the preferred embodiment of this invention.

FIG. 3 is a top view showing a built-in inductor on a substrate according to the preferred embodiment of this invention. As shown in FIG. 3, the field oxide layers 206, the first-type-ion-doped region 210 underneath the field oxide layers 206 and the second-type-ion-doped region 210 between field oxide layers 206 form a grid structure. The junctions between the first-type-ion-doped region 208 and the second-type-ion-doped region 210 also form a grid structure. Hence, any eddy current induced by the inductor 214 trying to flow in the X direction is stopped by the grid. With less eddy current loss, the Q-value of the inductor is maintained even at high operating frequency.

In conclusion, the advantages of the silicon chip built-in inductor structure include:

1. The field oxide layers, the first-type-ion-doped regions underneath the field oxide layers and the second-type-ion-doped regions between the first-type-ion-doped regions together form a grid-like structure that effectively stops the flow of an eddy current induced by an operating inductor. Consequently, the Q-value of the inductor can be maintained.
2. By doping dopants of opposite character into the first-type-ion-doped region and the second-type-ion-doped region to form p-n junctions, an effective barrier for eddy current is erected.
3. The steps for forming the field oxide layers, the first-type-ion-doped regions and the second-type-ion-doped regions are compatible with current semiconductor processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A silicon chip built-in inductor structure, comprising:
   a substrate having an active region and a region with grid-like field oxide devices, wherein the grid-like field oxide devices include a plurality of field oxide layers above the substrate, a plurality of first-type-ion-doped regions underneath the field oxide layers and a plurality of second-type-ion-doped regions between the field oxide layers, and each junction between the first-type-ion-doped region and the second-type-doped region impedes the flow of eddy current within the substrate;
   a plurality of active devices in the active region;
   a dielectric layer over the substrate that covers the active devices and the field oxide devices; and
   an inductor on the dielectric layer above the field oxide devices.

2. The structure of claim 1, wherein the substrate includes a silicon substrate.

3. The structure of claim 1, wherein the first-type-ion-doped region is a p-doped region and the second-type-ion-doped region is an n-doped region.

4. The structure of claim 1, wherein the first-type-ion-doped region is an n-doped region and the second-type-ion-doped region is a p-doped region.

5. The structure of claim 1, wherein the field oxide layers are formed in the substrate parallel to each other so that a grid-like structure is formed.

6. The structure of claim 1, wherein the first-type-ion-doped regions and the second-type-ion-doped regions are formed by ion implantation.

7. The structure of claim 6, wherein after the step of performing the ion implantation, an annealing treatment is performed.

8. A structure for blocking eddy current in a substrate induced by a silicon chip built-in inductor, wherein the structure is installed under the inductor electrically insulated from the substrate by a dielectric layer, comprising:
   a substrate having an active region and an isolation region;
   a plurality of field oxide layers, wherein the field oxide layers are laid parallel to each other in the substrate above the isolation region so that a grid-like structure is formed;
   a plurality of first-type-ion-doped regions, wherein the first-type-ion-doped regions are formed in the substrate underneath the field oxide layers; and
   a plurality of second-type-ion-doped regions, wherein the second-type-ion-doped regions are laid in the substrate between the field oxide layers, and a plurality of junctions are formed at the interface between neighboring first-type-ion-doped regions and second-type-ion-doped regions so that inductor induced eddy current in the substrate is blocked.

9. The structure of claim 8, wherein the substrate includes a silicon substrate.

10. The structure of claim 8, wherein the first-type-ion-doped region is a p-doped region and the second-type-ion-doped region is an n-doped region.

11. The structure of claim 8, wherein the first-type-ion-doped region is an n-doped region and the second-type-ion-doped region is a p-doped region.

12. The structure of claim 8, wherein the first-type-ion-doped regions and the second-type-ion-doped regions are formed by ion implantation.

13. The structure of claim 12, wherein after the step of performing the ion implantation, an annealing treatment is performed.

* * * * *